United States Patent [19]

Huang

[11] Patent Number: 5,155,440
[45] Date of Patent: Oct. 13, 1992

[54] HAND-HELD CABLE TESTER

[76] Inventor: George S. K. Huang, 444 Apricot Lane, Mountain View, Calif. 94040

[21] Appl. No.: 707,986

[22] Filed: May 22, 1991

Related U.S. Application Data

[63] Continuation-in-part of Ser. No. 446,207, Dec. 4, 1989, abandoned.

[51] Int. Cl.⁵ .................... G01R 19/00; H04B 3/46
[52] U.S. Cl. ........................ 324/539; 324/66
[58] Field of Search ............... 324/539, 66, 540, 556

[56] References Cited

U.S. PATENT DOCUMENTS

| | | | |
|---|---|---|---|
| 2,762,014 | 9/1956 | Anderson | 324/539 |
| 3,217,244 | 11/1965 | Glover | 324/539 |
| 3,528,104 | 9/1970 | Ehlschlager | 324/539 |
| 3,699,438 | 10/1972 | Webb | 324/539 |
| 4,220,912 | 9/1980 | Williams | 324/539 |
| 4,736,158 | 4/1988 | McCartney | 324/539 |
| 4,835,479 | 5/1989 | Haines | 324/539 |
| 4,937,529 | 6/1990 | O'Toole, III et al. | 324/539 |
| 4,986,929 | 11/1990 | Harick et al. | 324/66 |

FOREIGN PATENT DOCUMENTS

| | | | |
|---|---|---|---|
| 161560 | 10/1982 | Japan | 324/540 |
| 8908850 | 8/1989 | United Kingdom | 324/539 |

OTHER PUBLICATIONS

IBM Technical Disclosure vol. 16 No. 12 May, 1974 Cable Tester Formica 324 (66).

Primary Examiner—Jack B. Harvey
Assistant Examiner—Maura K. Regan
Attorney, Agent, or Firm—David Pressman

[57] ABSTRACT

A hand-held apparatus for testing cable harness for faults and performance impairments comprises three sets of voltage references, CMOS comparator circuitry, programmable DIP switches, an LED status display for error detection, an LED for indication of overall system condition, and a power source. The voltage dividers are utilized to determine reference voltages; each voltage divider comprises a resistor pair. In the preferred embodiment a first set of voltage references is utilized for checking open conditions and is generally associated with odd-numbered wires in the cable harness. A second and a third set of voltage references may be employed for all types of testing, with the second set of voltage references being generally associated with odd-numbered wires and the third set of voltage references being generally associated with even-numbered wires. The voltage references provide the CMOS logic level for a plurality of CMOS comparators in a VLSI gate array are linked to a status display and respond to variations in reference voltage. Each set of voltage references utilize large resistance values to decrease power consumption so that a 9V battery with an associated 5V regulator may be used in the preferred embodiment.

9 Claims, 12 Drawing Sheets

HAND-HELD CABLE TESTER

CROSS-REFERENCE TO RELATED APPLICATION

This is a continuation-in-part of application Ser. No. 07/446,207 filed Dec. 4, 1989, now abandoned.

BACKGROUND

1. Field of the Invention

This invention relates to cable testers, especially to hand-held cable testers employing voltage dividers and complementary metal oxide semiconductors for use in testing open conditions, wiring shorts, cross-wiring errors, crossing wire errors, intermittent shorts, and intermittent opens by manufacturing the cable while testing the same in a multi-cable harness.

2. Description of Prior Art

Electrical assemblies contain current paths between the components of the circuit. In many cases, these current paths consist of wires which act as conductors, transmitting an electrical signal from one part of the assembly to another or to external devices. As a general rule, the more complicated the assembly, the greater the number of signals. Consequently, complex assemblies often require a greater number of wires to conduct these signals. To simplify the manufacturing process and improve assembly serviceability, the designer of such an assembly typically organizes the various wires in groups according to their point of origin and their destination. Wires grouped in such a manner make up a fabricated assembly known as a cable harness.

Cable harnesses are manufactured in a variety of forms, depending on wire gauge, attachability, and other factors. Most cable harnesses, however, have several characteristics in common. By definition, all cable harnesses contain more than one wire. Also, cable harnesses are usually terminated by some form of connector on either end; in the case of branched cable harnesses, the harness can include many such connectors.

Whether the cable harness is constructed by human hand or through robotics, cabling errors often occur. For example a wire stressed during an automated production process can develop an open condition. A pair of neighboring wires may be shorted together when the connector is attached to the end of the cable. An assembler may cross two wires while inserting pins into the connector. Often an intermittent short or an intermittent open condition occurs. Such conditions are difficult to locate and frequently require a large expenditure of time and energy to locate.

To lower the impact of such problems on product quality, cable manufacturing facilities would benefit from a low-cost, easily-operated test apparatus that will isolate fabrication errors. Additionally, manufacturers who utilize cable harnesses in their products will benefit from such devices. In this case, the manufacturer could test the cable harness before installing it in the final assembly. Pretesting the cable harness helps minimize labor-intensive, post-production harness removals. Preinstallation tests can also shorten the final test phase for the assembly since, in the event of failure, a pre-tested cable can generally be eliminated as the cause. A cable test apparatus is also useful when attempting to troubleshoot an assembly in the field.

In determining whether cable testing is desirable, the manufacturer or field service planner must weigh the time required to complete the test against product quality standards, potential assembly rework costs, and repair overheads. On these grounds alone, balanced studies usually prove the advantages of performing cable tests. However, tester portability, ease of use, adaptability, cost, and other considerations can also be deciding factors.

PRESENT INVENTION

The cable tester of this invention is designed to help to solve these problems. The cable tester of this invention provides the manufacturer and/or field organization with a reliable means of identifying the most common cable harness problems. These problems include: open conditions on one or more wire, crossed wire pairs, shorted wire pairs, intermittent opens and intermittent shorts.

DEFINITIONS

For purposes of clarity, terms used in this application are defined as follows:

CMOS: Complimentary Metal Oxide Semiconductor. This refers to the three layers used in forming the gate structure of a field-effect transistor, which has very low power dissipation.

CMOS EXCLUSIVE: The use of a CMOS transistor to perform a Boolean logic operation. A logic ONE is left in a results register if either bit in any bit position of either register is a ONE. A ZERO is left if both are a ONE or both are a ZERO.

LED Display: Light Emitting Diode. A LED is a semiconductor element which consists of a small piece of silicon and some other chemical elements. When a positive voltage is applied to the anode lead, the diode emits light in an area that forms its display.

CMOS Comparator: A CMOS device for comparing two different signals or transcriptions of the same information to verify the accuracy of transcription, storage, arithmetic operation, or other processes, in which a signal is given dependent on some relation between two items. I.e., it is a circuit that compares two signals and indicates agreement or disagreement; it may provide a signal indicating whether they are equal or unequal.

DIP Switch: Dual In-line Package Switch. A package that consists of more than one micro-toggle switch and having two parallel rows.

NAND Gate: A logical operator having the property that if P is a statement and Q is a statement, then the NAND of P and Q is true if at least one statement is false, and false if all statements are true.

NOR Gate: A Boolean circuit that gives a truth table value of true only when both of the variables connected by the logical operator are false, i.e., the negation of an INCLUSIVE OR gate.

VLSI: Very Large Scale Integration. A VLSI circuit chip contains more than 100 gates or transistors.

VREFLOW: (Voltage/reference/low). Name for indicating a signal status.

SUMMARY OF THE INVENTION

The subject invention provides an improved means and method for determining and locating the above-identified problems associated with cables and cable harnesses. The cable tester of this invention utilizes three sets of voltage dividers. The first voltage divider set is attached to a 5 V regulator in the preferred embodiment and normally provides an output voltage to a second voltage divider set via a plurality of odd-numbered wires in the test cable harness.

A second voltage divider set, in turn, furnishes high inputs to a series of comparators which combine to activate a PASS display. If an off-numbered wire is open or crossed, one of the second set of voltage dividers will be driven low, forcing the associated comparator to activate a FAIL display for the wire in question.

A third voltage divider set is connected to the 5 V regulator and grounded via a plurality of even-numbered wires. These voltage dividers provide low inputs to another set of comparators which also combine to activate the PASS display. An open condition on an even-numbered wire results in a high divider output and a FAIL display for the faulty wire. When checking for shorted wire pairs, the cable tester utilizes only the second and third voltage divider set. As with the open test, the two divider sets provide reference voltages to the comparator bank. In this case, the second divider set (odd-numbered wires) normally furnishes a low input and the third divider set, a high input. These conditions activate a PASS display. If the test wire is shorted to its neighbor, the two sets of dividers are connected via the short and the output of the second divider set is driven high instead of low. This condition results in a FAIL display for the odd-numbered wire.

For convenience, portability and ease of use, the tester circuit in the preferred embodiment is implemented as a small, hand-held device utilizing VLSI technology and featuring test selection switches, connector adapters, adapter switches, and a LED display. The tester is user-friendly, requiring less than an hour's training time. All test results are available the moment that the cable harness is plugged into the tester socket, thus minimizing cable analysis time. For easy readability, the tester display furnishes both a test status PASS/FAIL indicator and a group of individual error LEDs that identify the failing wire. The cable tester is versatile and adaptable to a wide range of conditions: it can handle a wide variety of connector types through a complement of cable adapters. The tester can be programmed to test any number of adjacent wires (short test) or individual wires (open or crossed wire test) within its test range. The cable tester programming requires only that the user set a group of switches which are easily accessed from the exterior of the hand-held device. To further lower the cost of the unit, the tester makes advantageous use of VLSI chips for digital applications and a simple resistor network for analog circuit combinations. These combinations help to lower tester power consumption, reduce tester size and weight, optimize the per-unit price of the tester, and insure circuit reliably. Further reliability is provided by built-in, self-testing capabilities. With this feature, the user can instruct the cable tester to evaluate the condition of its power source, as well as the functionality of its comparator logic.

OBJECTS AND ADVANTAGES

Accordingly I claim the following as the objects and advantages of my invention: to provide an apparatus for easily, reliability, and accurately testing cables and cable harnesses for open conditions, wiring shorts, intermittent open, intermittent short, cross-wiring errors and other conditions therein, regardless of the type of cable, to provide an apparatus for testing cables and cable harness which requires a minimum of skill and training to use, and to provide such an apparatus which facilitates a complete test analysis of a cable or a plurality of cables being applicable to cable and cable harness manufacture or alternatively, may be used in the field as a testing device.

In addition I claim the following additional objects and advantages: to provide a cable testing apparatus which may be hand held, to provide such an apparatus having a detachable adapter, to provide an apparatus with built-in self testing capabilities, and to provide such an apparatus which is easily adjusted and adaptable to a variety of cable sizes and types.

Readers will find further objects and advantages of the invention from a consideration of the ensuing description and the accompanying drawings.

BRIEF DESCRIPTION OF THE DRAWINGS

FIGS. 1A and 1B show a schematic diagram illustrating the circuitry according to the invention which the cable tester uses to perform an open circuit or crossed wire test against a sixty-pin wiring harness (ribbon cable).

FIG. 5' is an illustration of a cable adapter which is attached to a hand-held cable tester.

Figure 1A:
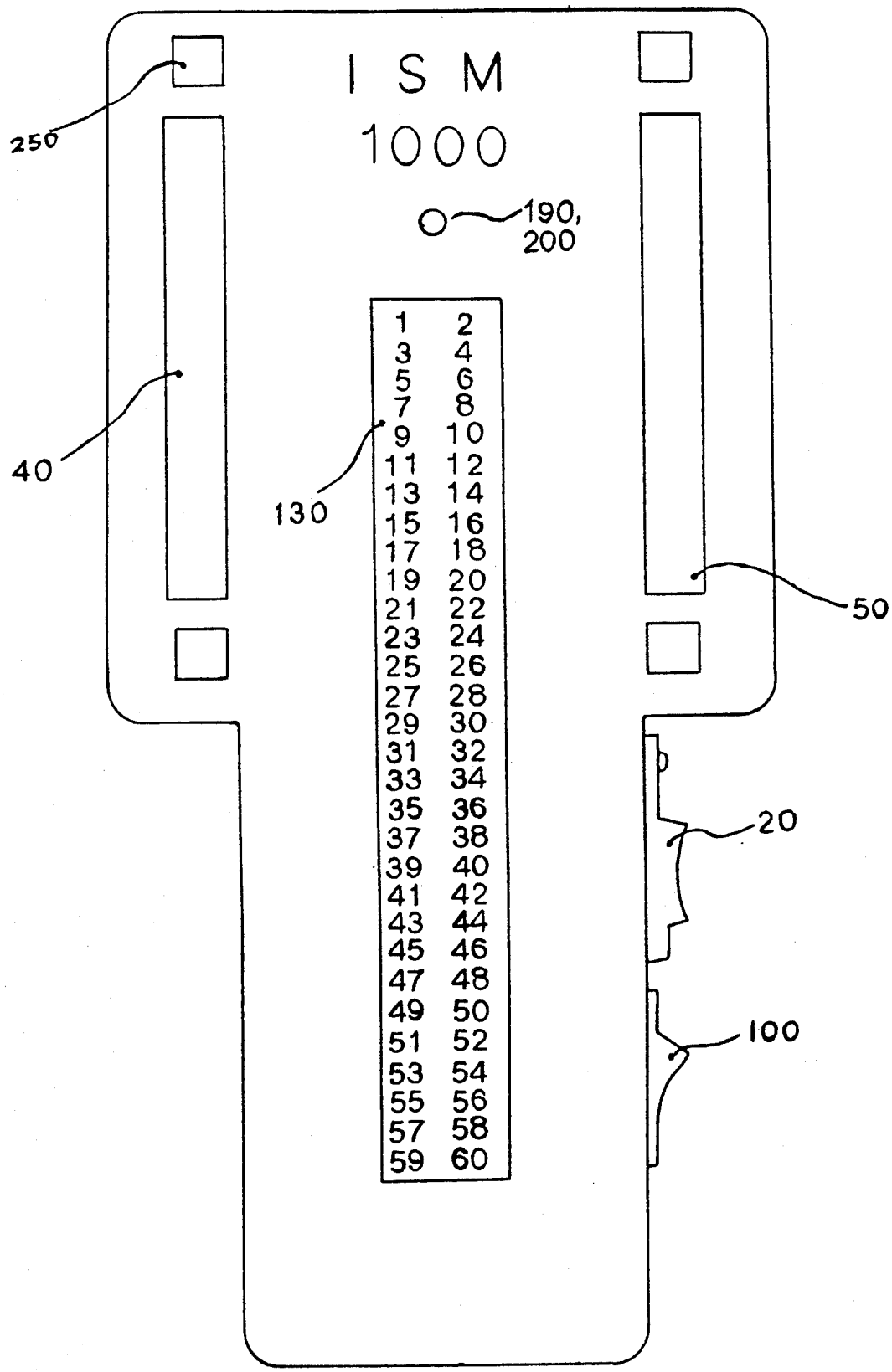
FIGS. 1A and 1B show a hand-held cable tester, according to the invention. FIG. OA shows a front view thereof and FIG. OB shows a rear view thereof.
Figure 1A:
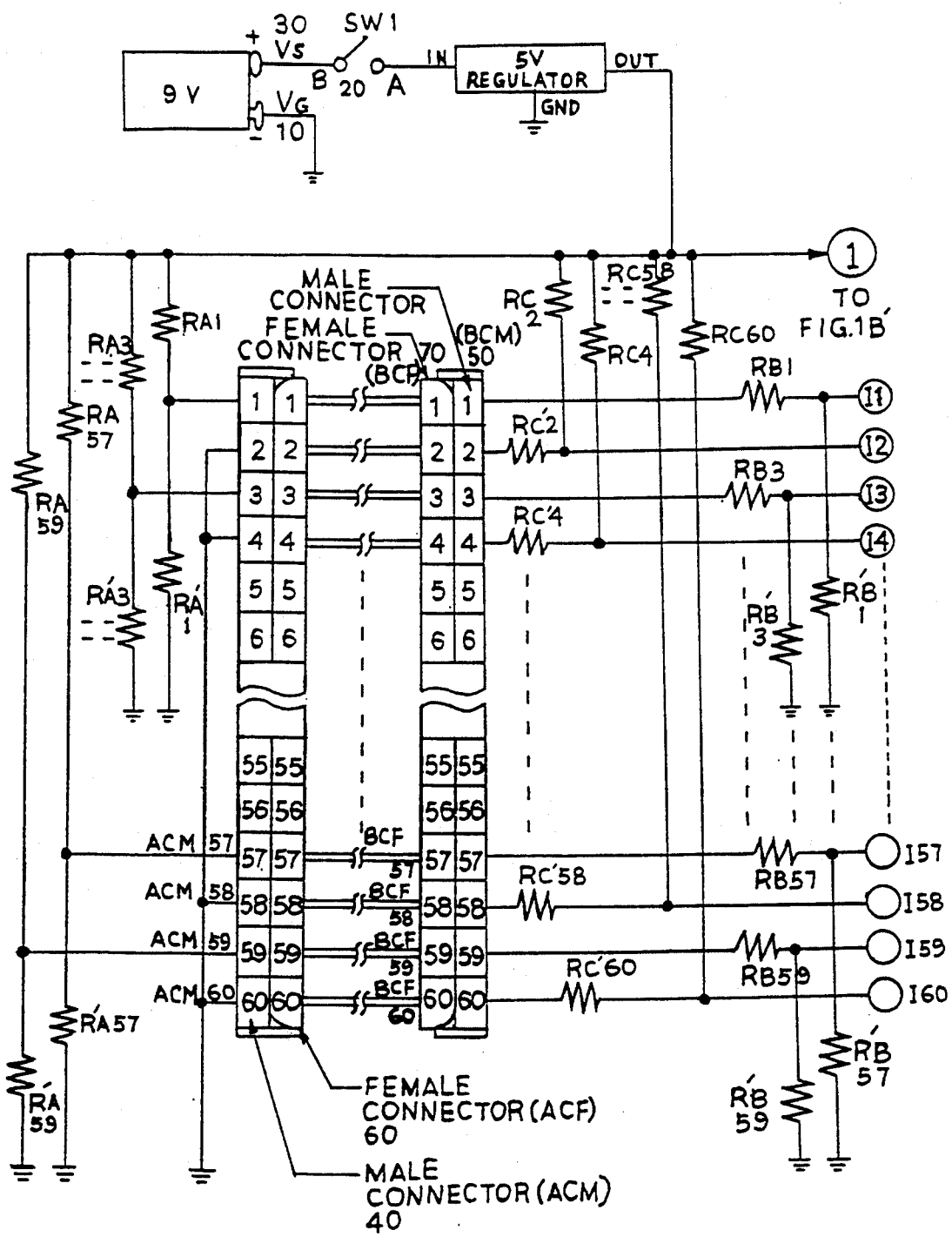
Figure 1B:
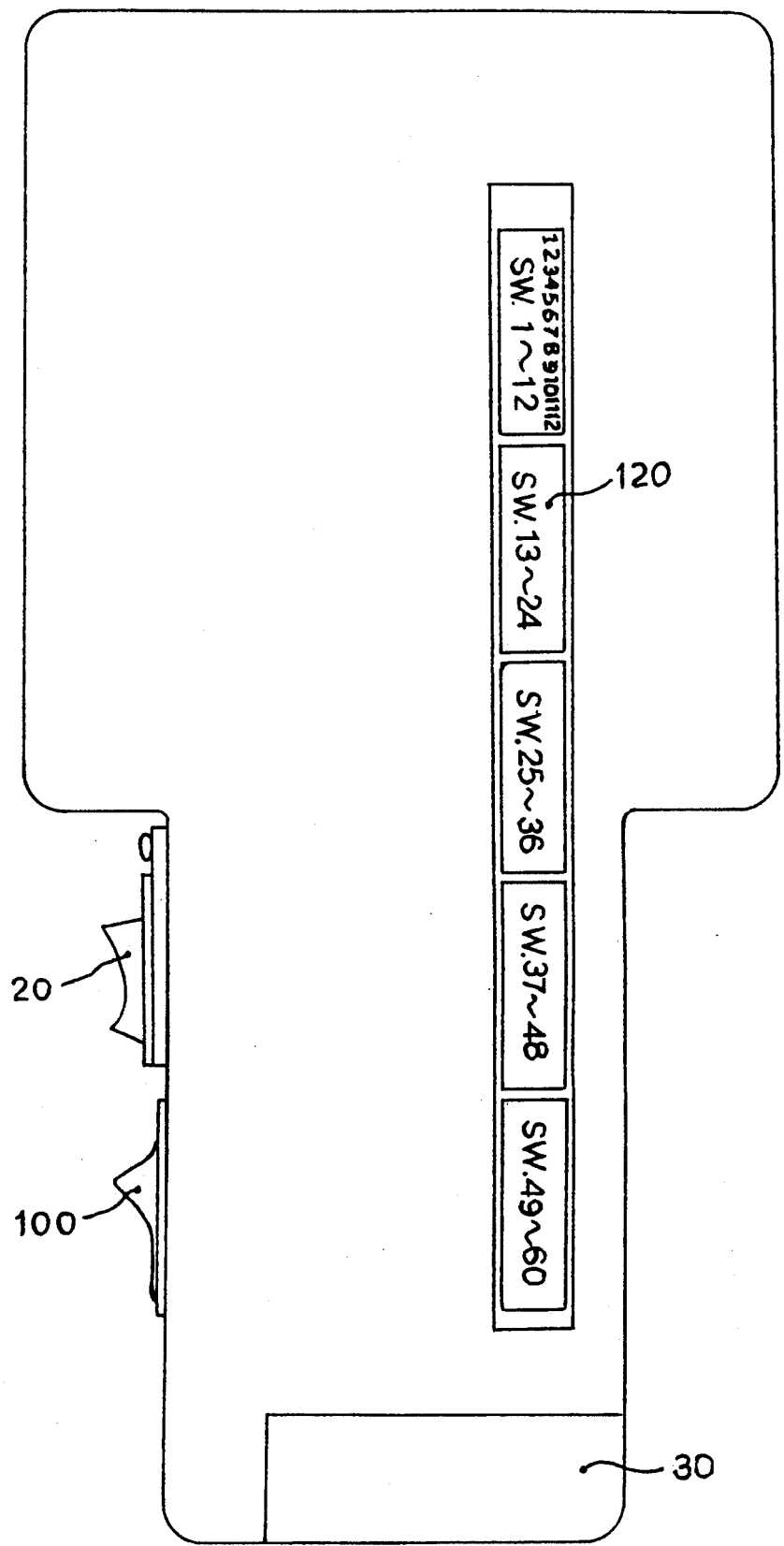
Figure 1B:
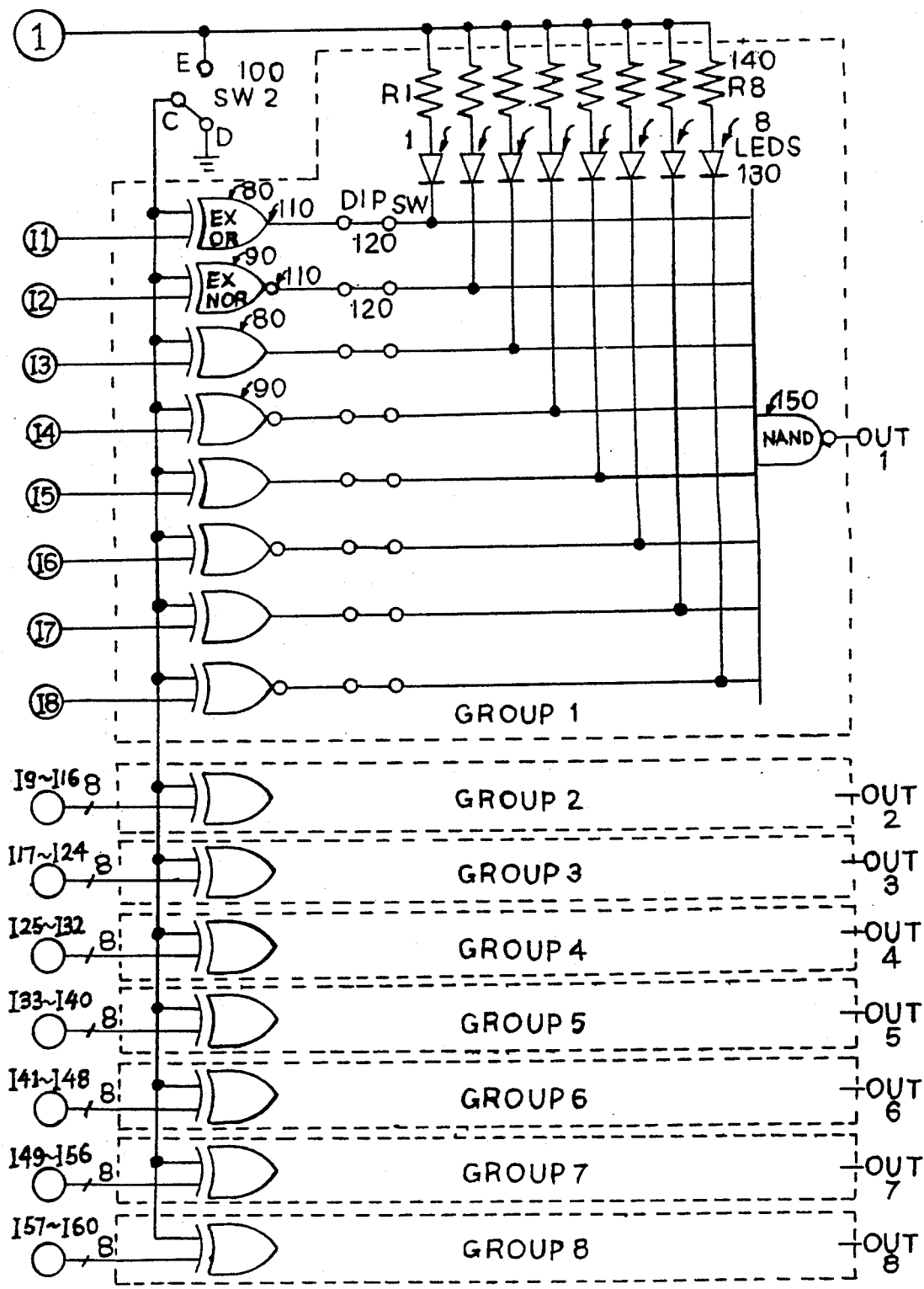

DETAILED DESCRIPTION—PREFERRED EMBODIMENT—FIGS. 1A and 1B

FIGS. 1A and 1B shows a hand-held cable tester according to a preferred embodiment of the invention. It has two connectors or headers, 40 and 50, respectively, a bicolor green/red LED 190/200 respectively, a status display 130, a power switch 20, an open/short toggle switch 100, four quick-release receptacles for easy detachability of adapter boards (not shown), a plurality of DIP switches 120, and a 9 V power source 30.

FIGS. 1A' and 1B'

FIGS. 1A' and 1B' show a schematic diagram of the tester performing an open circuit or crossed wire test on a typical sixty-pin ribbon cable according to the preferred embodiment of the invention. The source voltage for the circuit is provided in the preferred embodiment by a 9 V battery whose negative terminal (VG) 10 connects directly to ground and whose positive terminal (VS) 30 connects via a tester power switch SW1 or 20 to the input of a 5 V regulator and thence to the circuitry described herein.

In FIG. 1A′, beginning at the left side of the drawing is a first of three sets of voltage dividers. This voltage divider set consists of thirty pairs of resistors, the resistors of each pair being identified by the Ra and Ra′ prefixes, respectively. The tester provides one Ra/Ra′ voltage divider for each of thirty odd-numbered test wires (i.e., 1, 3, 5, . . . 59). Each Ra/Ra′ voltage divider is individually defined by a number suffix. In other words, the Ra/Ra′ voltage divider for test wire 1 is designated as Ra1/Ra1′. These voltage dividers will hereafter be referred to as the RaX/RaX′ dividers (where X represents an odd-numbered wire).

Each voltage divider is connected to the 5 V regulator via its RaX resistor and to ground via its RaX′ resistor. The output of these dividers is taken between the RaX and RaX′ resistors. Assuming that the 5 V regulator is switched on and the battery has sufficient charge to drive the regulator, this output of the resistor pair will be approximately 3 volts. Each divider's output is connected to an odd-numbered pin ACMX (where X represents an odd-numbered pin) in male connector 40 located on the exterior of the tester. Connector 40 in turn, is attached to a female cable harness connector 60 (connections designated as ACFX). The other end of the cable harness is connected to a harness connector 70 (connections designated BCFX) which in turn is attached to a second male connector 50 (pins designated BCMX) on the exterior of the tester.

Next a second voltage divider set at the right side of FIG. 1A′ includes thirty pairs of resistors, each pair being identified by the Rb and Rb′ prefixes. The cable tester provides one Rb/Rb′ voltage divider for each of the thirty odd-numbered wires in the cable harness. Individual Rb/Rb′ voltage dividers are defined by a number suffix and will be referred to as RbX/RbX′ dividers, where X represents an odd-numbered wire.

The RbX/RbX′ dividers are connected to respective odd-numbered pins in male connector 50 via their RbX resistor and to ground via their RbX′ resistor.

In operation, if the associated odd-numbered test wire is good, the RbX/RbX′ divider will receive approximately 3.0 V from the output of the corresponding RaX/RaX′ divider. The output of the RbX/RbX′ dividers is taken between the RbX/RbX′ resistors; with a good test wire, this output will be only slightly lower than the 3 V input. Each RbX/RbX′ output is tied to one of two inputs on a CMOS input. Each RbX/RbX′ output is tied to one of two inputs on a CMOS EXCLUSIVE OR GATE 80 (FIG. 1B). The other input is tied to ground via a mode selection switch SW 2 or 100 since the switch is set to a position D, which position is used for an open circuit/crossed wire test.

A third voltage divider, set as shown in FIG. 1A′, includes thirty pairs of two resistors, the resistors of each pair being identified by their Rc and Rc′ prefixes. The cable tester utilizes one Rc/Rc′ voltage divider for each of the thirty even-numbered wires (i.e., 2, 4, 6, . . . 60) in the cable harness. Each divider is individually defined by a number suffix. The third voltage divider set will be referred to as the RcX/RcX′ dividers, where X represents an even-numbered wire. The RcX/RcX′ dividers are directly attached to the 5 V regulator via their RcX resistor and to the respective even-numbered pins in male connector 50 via their RcX′ resistor. A ground connection for the divider is located on the opposite side of the test cable harness within male connector 40.

In operation, if the associated test wire is good, the RcX/RcX′ divider will be operational. The divider output is taken between the RcX/RcX′ resistors. For a good test wire, this output should be approximately 0.65 V. Each RcX/RcX′ output is connected to one of two inputs on a CMOS EXCLUSIVE NOR GATE 90 (FIG. 1B). The other input is shorted to ground due to the D setting of mode selection switch SW2/100.

FIG. 2

Figure 2:
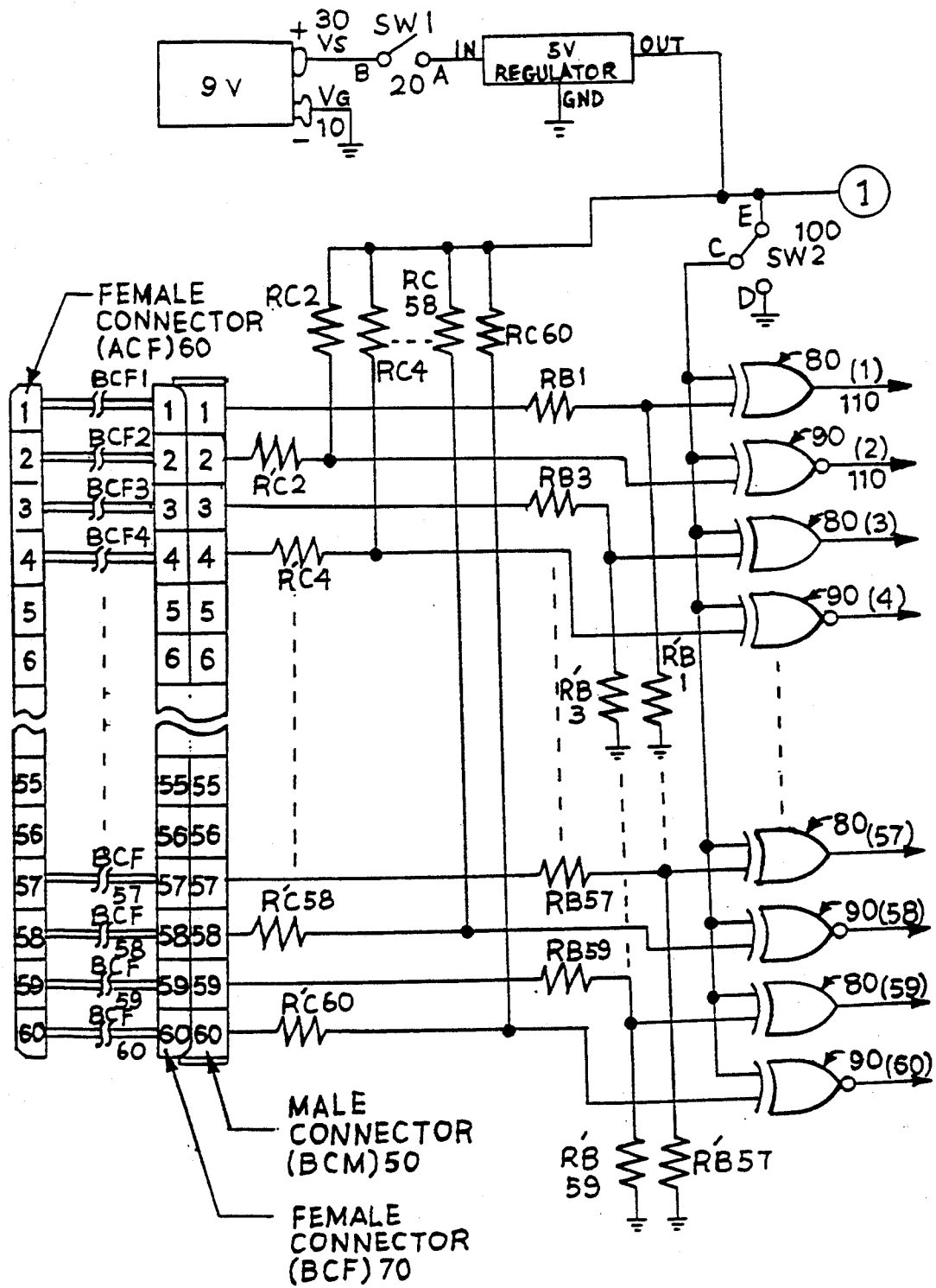
FIG. 2 is a schematic diagram illustrating the circuitry that the cable tester uses to perform a shorted wire test against a sixty-pin wiring harness (ribbon cable).

FIG. 2 shows a schematic diagram of the cable tester evaluating a sixty-pin ribbon cable for the presence of shorted wire pairs. This figure is identical to FIG. 1A with the following exceptions:

Only one end of the cable harness is connected to the tester; the remaining end is free-floating. In this case, female connector 70 of the cable harness is attached to male connector 50 of the tester. Because one end of the cable harness is not connected, only a portion of the tester's circuitry is used. In effect, this type of connection disables the first voltage divider set (RaX/RaX′). Consequently the second voltage divider set (RbX/RbX′) is no longer attached to a voltage source. The outputs of these dividers are therefore forced to ground.

The third voltage divider set (RcX/RcX′) in FIG. 1A′ is normally attached to ground via the cable harness and the tester's male connectors. The RcX/RcX′ dividers have lost their grounding because one end of the cable harness is free. As a result, the outputs of the RcX/RcX′ dividers are forced to the level of the 5 V regulator; and, mode selection switch SW2/100 is now set to the "E" position for a shorted wire test. This switch setting directly connects one input for each of the CMOS comparators, 80 and 90, to the 5 V regulator.

Figure 3A:
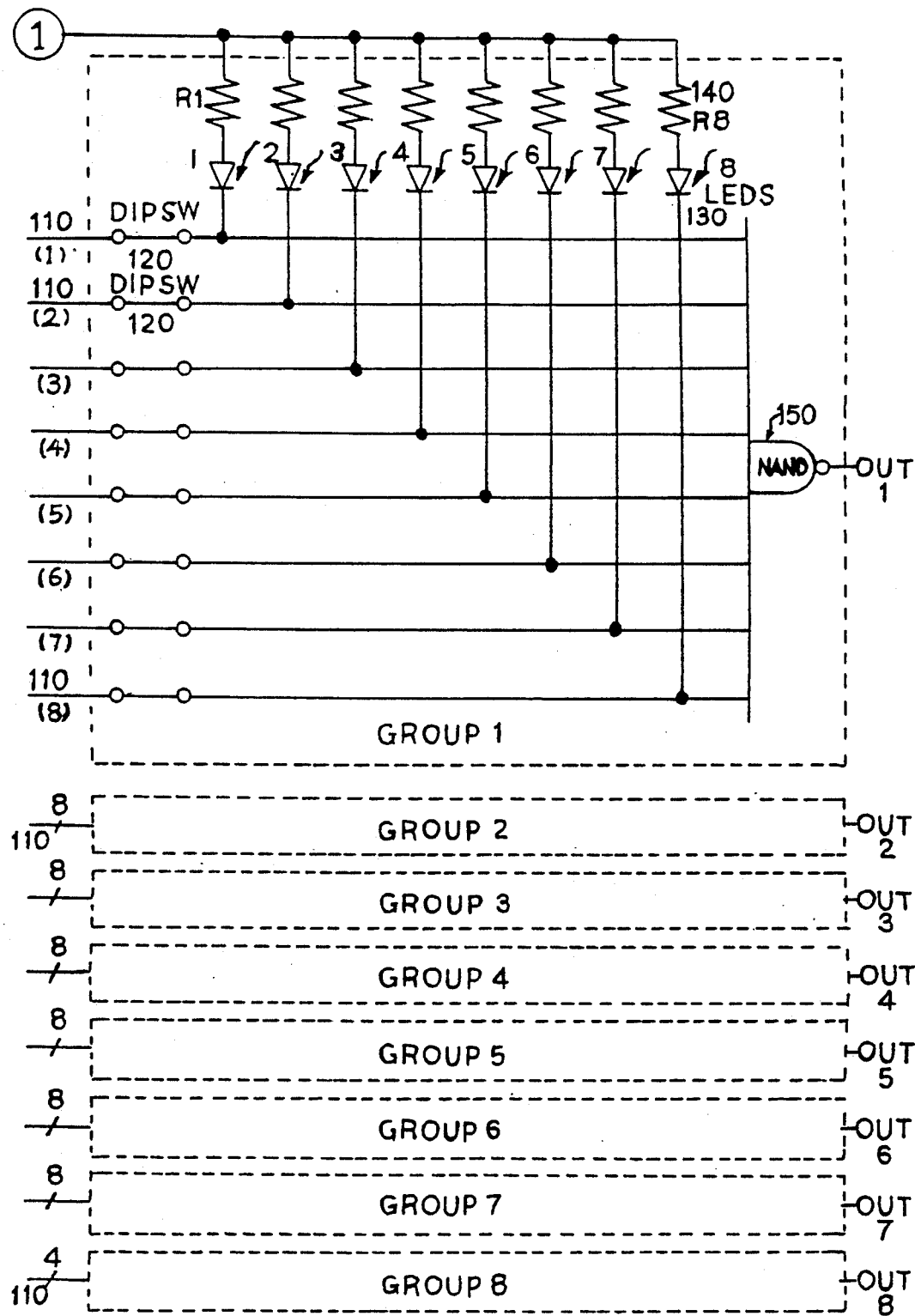
FIGS. 3A and 3B is a schematic diagram illustrating the circuitry that the tester uses to set its PASS/FAIL and individual wire LED displays.
Figure 3B:
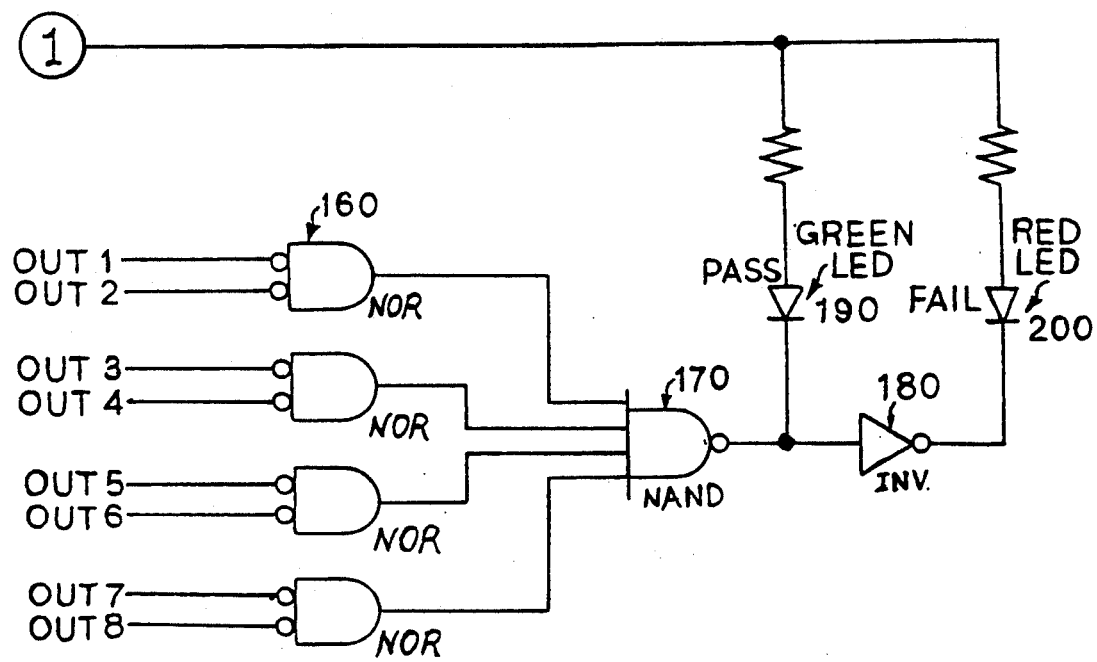

FIGS. 3A and 3B

FIGS. 3A and 3B are schematic diagrams of the status display portion of the tester. The display area is configured to accommodate a sixty-pin ribbon cable. This portion of the circuitry is used to display test results during all forms of cable harness evaluation, as well as during self-testing. Beginning at the left side of the diagram, sixty individual outputs 110 of the CMOS comparator bank (80 and 90 in FIG. 1) are fed to eight identical circuit groupings. These circuit groupings develop the error display for the individual wires and are identified as GROUP X (where X represents the group number). With the exception of GROUP 8, all groups in this configuration accommodate eight comparator outputs. Because the tester is preset to handle a sixty-pin cable harness, GROUP 8 receives only four comparator outputs. Within each group, every comparator output is connected to a programmable DIP switch 120. Assuming that each of these switches is closed, each comparator output is connected to two components:

- Each comparator output is connected to the cathode of an individual error-status LED 130. The anode of each LED is connected to the 9 V source via a current-limiting resistor 140. If the error detection circuitry locates an error on a particular wire, the appropriate error status LED lights; and,
- each comparator output is connected to a NAND gate 150 that services the group.

The output of NAND gate 150 for each group is paired with the output of the adjacent group. For example, the output of the GROUP 1 NAND gate is paired with the output of the GROUP 2 NAND gate; the output of GROUP 3 with the output of GROUP 4; etc. Each of these output pairs acts as the input for one of four low-active NOR gates 160 (FIG. 3B). The outputs of these four gates, in turn, act as inputs for another NAND gate 170. This NAND gate is directly attached to PASS LED 190 and is indirectly attached to FAIL LED 200 via an inverter 180. The two LEDs are connected to the 5 V regulator via resistors. Under normal circumstances, the PASS LED is lit. However, if the error detection circuitry locates a failure in the cable harness, NAND gate 170 provides a high input to the inverter and FAIL LED 200 lights.

Figure 4A:
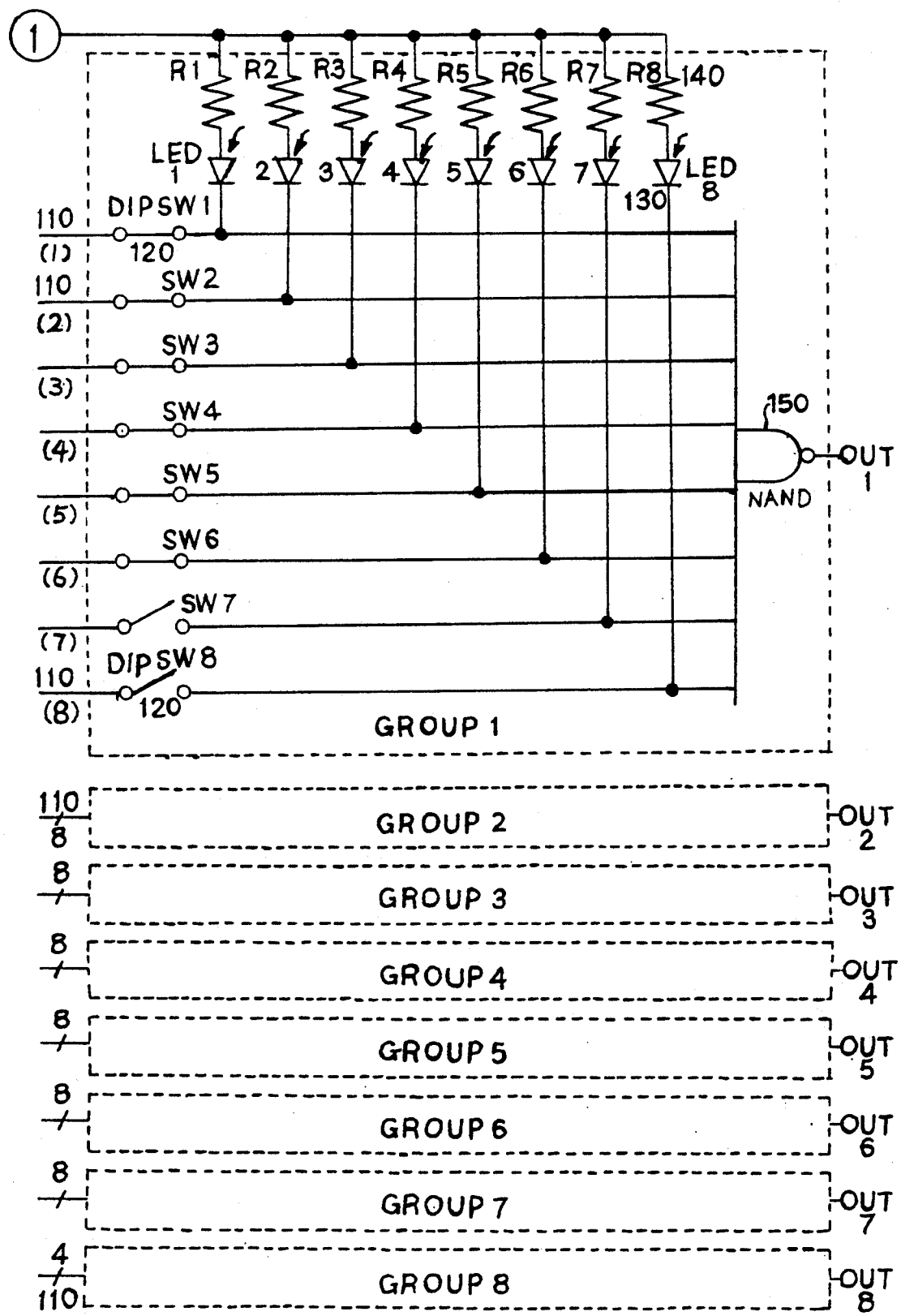
FIGS. 4A and 4B are schematic diagrams illustrating the effect of the programmable switches in controlling the number of wires to be tested.
Figure 4B:
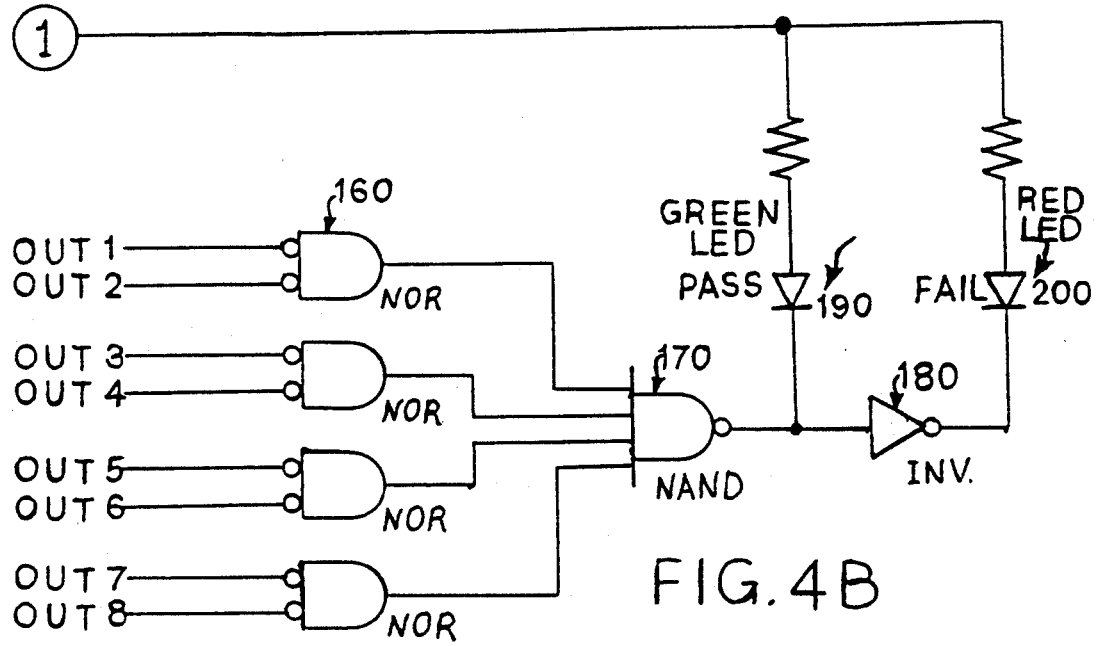

FIGS. 4A and 4B

FIGS. 4A and 4B illustrate the effect of programmable DIP switches on the status display portion of the circuit. FIG. 4A assumes a six-pin cable harness. FIG. 4 is identical to FIG. 3 with one exception: In FIG. 4A, programmable DIP switches 120 are set to accommodate as six-pin cable harness. This configuration results in closed switches for comparator outputs 110, i.e., switches 1-6 of GROUP 1 and open switches 7 and 8. By implication, DIP switches 1-6 pass the associated comparator outputs to the remainder of the status display circuitry. Open switches 7-60 inhibit the individual error LEDs for the associated comparator outputs.

The open condition of these switches also eliminates the associated comparator outputs from consideration by the PASS/FAIL circuitry (elements 160-200).

Figure 5:
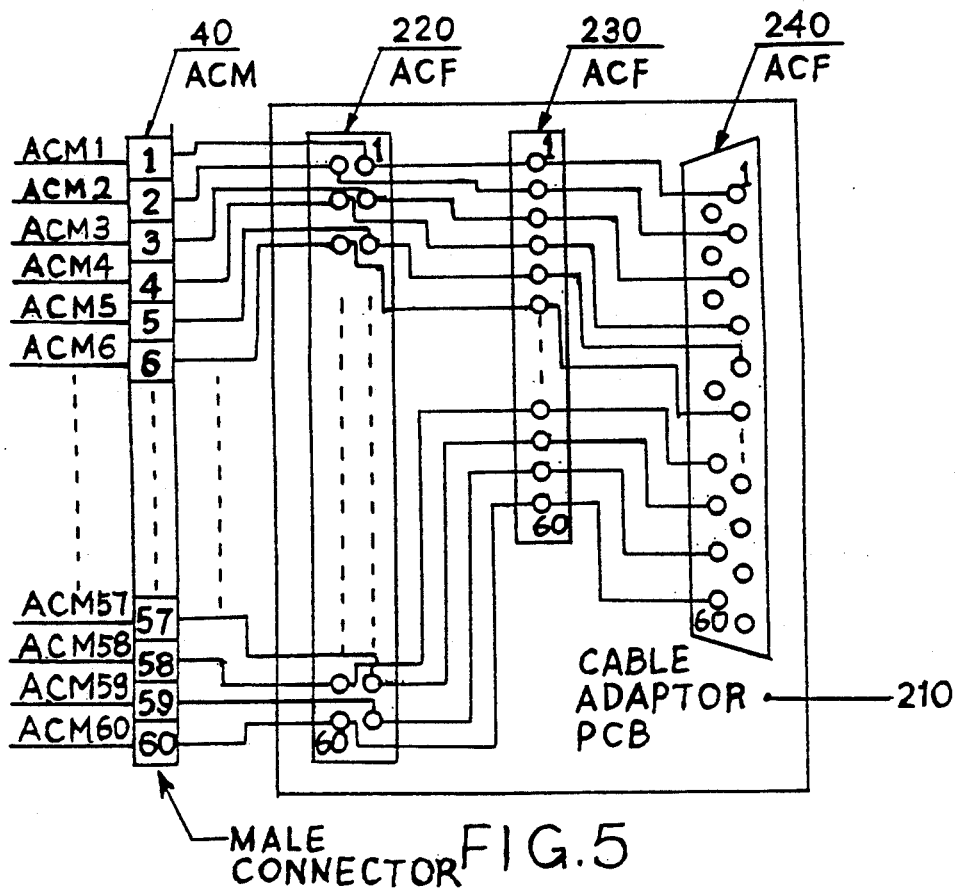
FIG. 5 is a schematic diagram illustrating a cable adapter PCB and its connection to the tester.
Figure 5:
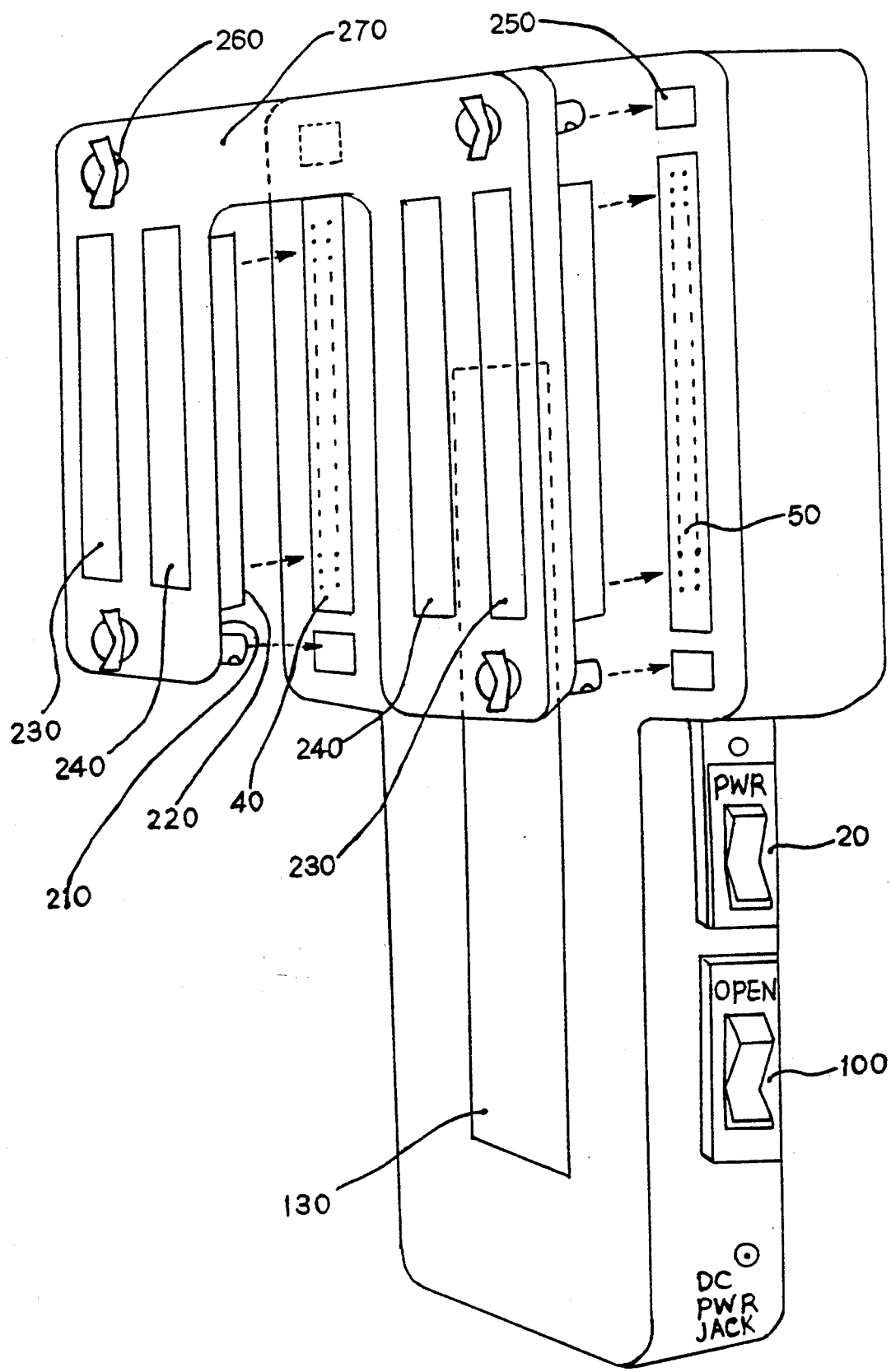

FIGS. 5 and 5'

FIG. 5 is a schematic diagram of a cable adapter PCB (printed circuit board) and FIG. 5' is an illustration of an adapter cover 270 for the cable tester in the preferred embodiment of the invention. Cable harnesses are manufactured with a variety of connector configurations. Earlier figures used examples involving a sixty-pin ribbon cable and the type of connector generally fitted to such a cable. FIG. 5, however, illustrates one of many cable adapter PCBs available for the tester. FIG. 5' illustrates how the adapter PCB and the cover attach to the cable tester by using four studs 260 to fasten to four quick-release receptacles 250. These cable adapters allow the user to analyze cables equipped with a wide range of connector-types. Since the basic design of the various cable adapter PCBs is similar, FIG. 5 and FIG. 5' are representative examples.

At the left side of FIG. 5, male connector 40 has pins designated as ACMX (where X represents a pin number). Cable adapter PCB 210 is attached directly to this connector via female connector 220 (connections designated as ACFX). In this example, the connection points are matched on a one-to-one basis, with ACM1 mated to ACF1, ACM2 mated to ACF2 etc. Each of the ACFX connection points is electrically tied to one of the connection points on a second and third connector (230 and 240, respectively).

While male connector 40 and female connection 220 used two rows of thirty pins each (sixty pins total), connector 230 employs a single row of sixty pins. In the case of connector 240, the plug shape differs from that of connectors 40 and 220. Thus, by means of electrical traces, the tester's connector configuration has been adapted to two new configurations.

The cable adapter PCB shown in FIG. 5 provides adapters for sixty-pin cables only, which reside under the preferably detachable adapter cover 270 shown in FIG. 5'. However, other types of cable adapter PCBs allow the user to test cables with fewer pins. With this type of cable adapter PCB, the user must ensure that the test circuit is disabled for all unused pins; this task is accomplished via programmable DIP switches 120 as shown in FIG. 0B and FIG. 4.

FIG. 6

Figure 6:
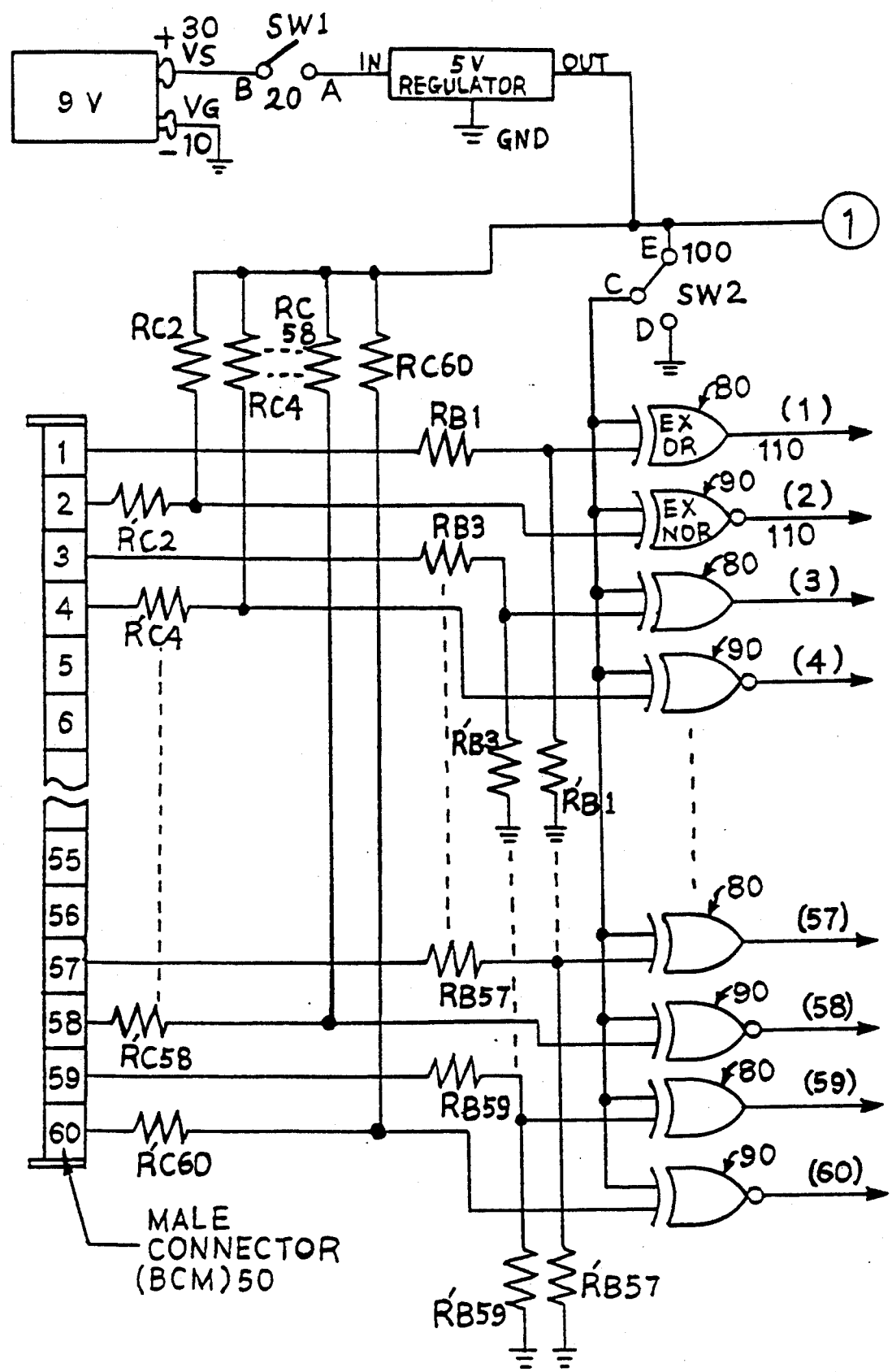
FIG. 6 is a schematic diagram of the circuitry that the cable uses when performing an internal component and trace check against its comparator logic and 9 V battery.

FIG. 6 illustrates the tester circuitry utilized during self-testing. The self-test evaluates the condition of the comparator logic only. FIG. 6 is identical to FIG. 2 in all but one respect. In FIG. 2, one end of a test cable harness is attached to male connector 50 while FIG. 6 includes no such attachment.

FIG. 7

Figure 7:
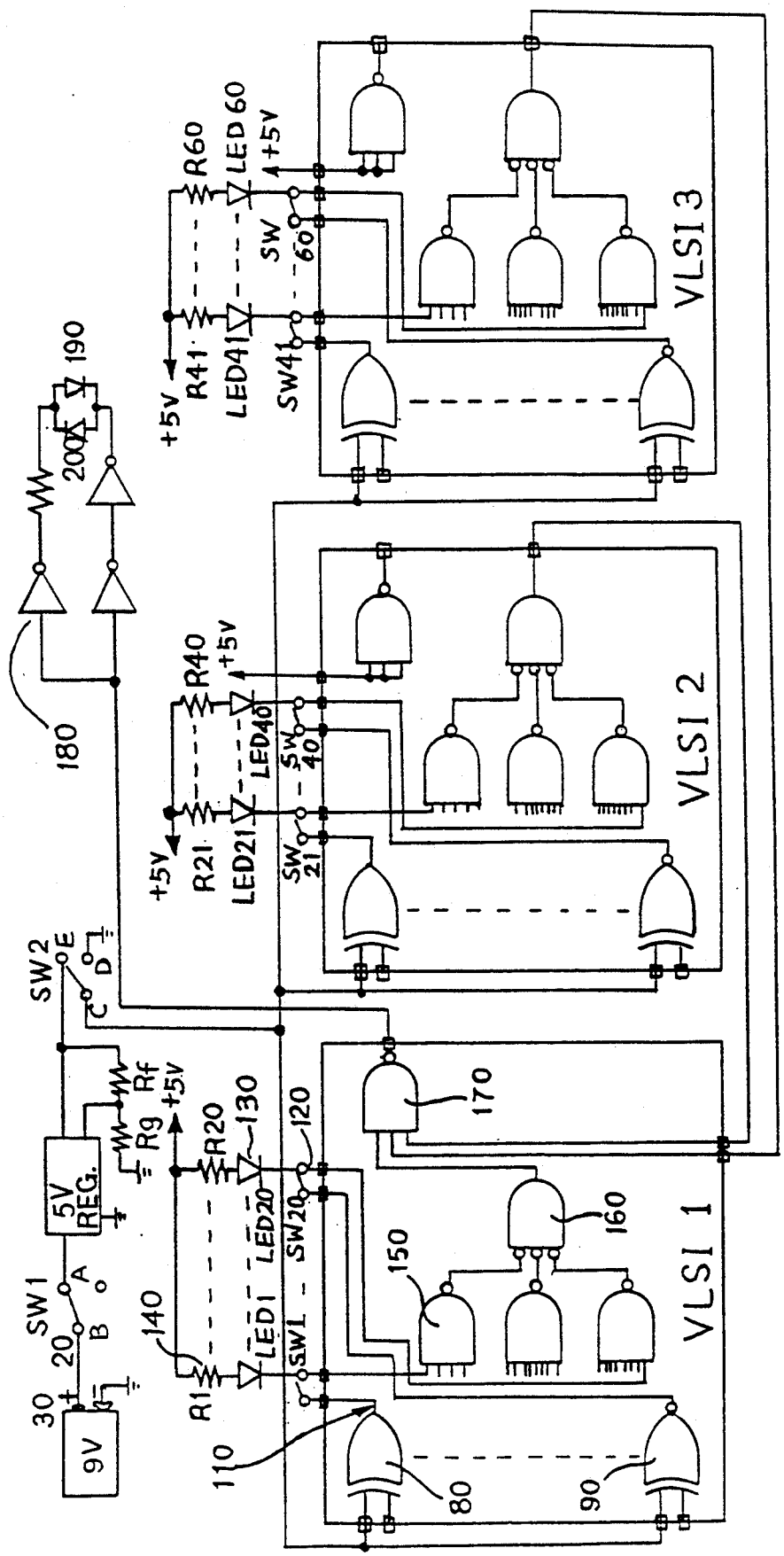
FIG. 7 is a schematic diagram illustrating the digital circuitry integrated by using three VLSI chips to replace the discrete components for the logic circuitry.

FIG. 7 illustrates a schematic diagram of VLSI circuitry for the cable tester. The logic function described above in reference to FIGS. 1-4 is similar to that illustrated in FIG. 7. However in the embodiment illustrated in FIG. 7, three VLSI chips are utilized. Each VLSI chip is identical and can test up to twenty conductors without expansion, or can be expanded to as many conductors as desirable by cascading several VLSI chips. FIG. 7 also illustrates two resistors Rf and Rg to set up the 5V power for activating the VLSI chips and the entire test system. By providing the CMOS logic level sensing means in a VLSI gate array, significant economy of size and weight may be achieved.

Operation

The cable tester detects five types of wiring faults: open conditions, crossed wire pairs, shorted wire pairs, intermittent opens, and intermittent shorts. Additionally, the tester can perform self-tests to ensure proper internal function. When completing a cable test or self-test, the user sets the tester to one of two operating modes, Open or Short, depending on the type of analysis required. For example, a user who suspects an open condition, a crossed wire pair, or intermittent opens sets the tester to Open Mode. On the other hand, if the user wishes to test the cable harness for shorts or intermittent shorts, the tester is set to Short Mode. The Short Mode is also employed during self-tests.

The following description illustrates the cable tester operation under each of the two operating modes. Because the status display logic is common to all forms of testing, this subject will be covered separately.

Open-Mode Testing

To evaluate a cable for open conditions, crossed wires, and intermittent opens, the user must complete a series of preliminary steps. First, the user sets power switch 20 to the ON position. Once the tester is powered, the user sets programmable DIP switches 120 according to the number of individual wires in the test cable harness. For example, if the cable harness contains six wires, the user sets the first six DIP switches to the ON position and all of the remaining DIP switches to the OFF position (see FIG. 4A). This action disables all unused connector points and their associated error LEDs.

The user then sets Mode switch 100 to the ground or Open-mode position (D) as shown in FIG. 1B; this action places a logic level on one of the two inputs for each EXCLUSIVE OR gate 80 and EXCLUSIVE NOR gate 90 in the CMOS comparator array.

The user now attaches one end of the cable harness to connector 40 and the other end to connector 50. At this point, the tester begins the evaluation sequence summarized in the following text. As the operational flow for the odd-numbered wires differs from the flow for the even-numbered wires, the illustration is divided into two parts.

Odd-Numbered Wires For each odd-numbered wire, the cable tester utilizes two voltage dividers (RaX/RaX' and RbX/RbX') to set two reference voltages. Each voltage divider consists of a resistor pair as shown in FIG. 1A. The first of these dividers RaX/RaX' has a 1 to 2.6 ratio and a current of approximately 25 $\mu$A. As a product of the resistor ratio, the RaX/RaX' voltage divider sets the output voltage (VREF) at approximately 60% of the source voltage (5V). This output is tied to one end of the test wire. The main function of the RaX/RaX' voltage divider is to verify that the +9V source is operational while delivering the bulk of the source voltage to the second voltage divider via the test wire.

Assuming that the test wire is not open or crossed. The output of the RaX/RaX' divider passes to the RbX/RbX' divider which connects in parallel with the RaX' resistor. The RbX/RbX' voltage divider utilizes a similar divider ratio (1 to 2.6), with the bulk of the voltage dropped across the grounded resistor RbX'.

The output of this divider (VREFHI) is tied to a high-input impedance EXCLUSIVE OR gate 80. Because the gate displays a very high impedance at the input, the voltage divider resistance ratio is not materially altered by the presence of the gate. Virtually all of the current in the RbX/RbX' divider flows to ground through resistor RbX', ensuring a high voltage level at the gate input. The other EXCLUSIVE OR gate input is tied to ground when the user selects Open Mode. Thus, one EXCLUSIVE OR gate input is high (VREFHI) while the other is low (SW2 to ground). This condition activates the gate, driving the EXCLUSIVE OR comparator output high for that test wire.

In the event that an odd-numbered test wire is open, the RbX/RbX' resistor pair no longer acts as a voltage divider. Under these circumstances, the VREFHI output is forced to ground because the entire voltage drop for the test circuit occurs across the open wire. Consequently, the VREFHI input to the EXCLUSIVE OR gate is driven low. This low input, matched with the SW2 low input, yields a low output from the EXCLUSIVE OR gate.

For wire crosses, the RbX/RbX' resistor pair no longer is connected to the RaX/RaX' voltage divider output but, rather to ground via the even-numbered pin. Under these circumstances, the VREFHI output is forced to ground because the circuit has no input voltage and experiences no current flow. Thus, the VREFHI input to the EXCLUSIVE OR gate drops to a low logic level which, in turn, drives the EXCLUSIVE OR gate output low.

Even-numbered Wires For each even-numbered wire, the cable tester utilizes one voltage divider designated as RcX/RcX'. As in the odd-numbered example, the voltage divider consists of a resistor pair (FIG. 1). In this case, the voltage divider has an approximately 6.6 to 1 ratio and a current of approximately 25 $\mu$A. The RcX resistor is tied to the 5V regulator and accounts for approximately 87% of the voltage drop. The RcX' resistor is tied to ground via the test wire; this resistor accounts for the remaining voltage drop. The output of the RcX/RcX' divider is a reference voltage (VREFLOW) equivalent to approximately 13% (0.65V) of the source voltage, assuming that the test wire is not open. VREFLOW is tied to a high-input impedance EXCLUSIVE NOR gate as one of the two inputs. The other gate input is initially tied to ground at SW2 when the user selects the Open Mode setting. With both inputs low, the output of the EXCLUSIVE NOR gate is driven high.

If an even-numbered test wire is open, the RcX/RcX' resistor pair no longer acts as a voltage divider. Under these conditions, the entire 5V regulator voltage drops across the test wire. Since VREFLOW originates at a point electrically above the test wire, the VREFLOW reference voltage is forced to +5V instead of to the expected +0.65V. As a result, the VREFLOW input to the EXCLUSIVE NOR gate is driven high. The high VREFLOW input, matched with the low SW2 input, yields a low EXCLUSIVE NOR gate comparator output. The cable tester does not sense wire crosses for the even-numbered member of the crossed pair, that is, the EXCLUSIVE NOR gate's output remains high; instead, the tester senses the wire cross for the odd-numbered member of the pair when the EXCLUSIVE OR gate's output drops low.

Short Mode Testing

To test a cable for shorted wire pairs, the user must complete several preliminary procedures. As in Open Mode evaluation, the user powers up the tester and sets the programmable DIP switches according to the number of wires in the cable harness. In this case, however, the user sets Mode switch 100 to the Short position E as shown in FIG. 2. This action connects the +5V regulator to one of the two inputs for each EXCLUSIVE OR gate 80 and EXCLUSIVE NOR gate 90 in the comparator array. Thus, each gate is initialized at a high logic level. After setting the Mode switch, the user attaches one end of the cable harness to connector 50 on the exterior of the tester. The other end of the cable harness remains free. At this time, the tester begins the evaluation cycle covered in the following test.

To isolate a shorted wire pair, the tester utilizes the RbX/RbX' voltage dividers, as shown in FIG. 2. The RbX/RbX' voltage divider is normally associated with odd-numbered test wires only and has a 1 to 5.6 divider ratio. One of the resistors RbX is connected to the test wire via connector 50 while the other resistor RbX' grounds the divider. Unless the wire in question is shorted, the RbX/RbX' divider is not connected to the source voltage. The circuit, therefore, receives no current and the output (VREFHI) of the divider is 0V. VREFHI is tied to an EXCLUSIVE OR gate 80, providing the gate with a low logic level as one of its two inputs. The other gate input was forced high when the user placed Mode switch 100 in the SHORT position (E). As a result of the high and low input combination, the EXCLUSIVE OR gate's output is driven high.

Turning to the RcX/RcX' voltage divider, FIG. 2 shows that this divider is exclusively associated with the even-numbered wires. This voltage divider has a 6.6 to 1 divider ratio. One resistor (RcX) divider is connected to the +5V regulator while the other resister (RcX') is connected to the test wire. Since the other end of the test wire is free-floating, the circuit is not grounded and, thus, experiences no current flow. Without current, the output (VREFLOW) of the RcX/RcX' voltage divider is forced to the level of the regulator voltage, +5V (a high logic level). VREFLOW and the high input from the E setting of switch 100 act as the inputs for an EXCLUSIVE NOR gate 90. These two high inputs drive the output of the EXCLUSIVE NOR gate high.

In the event that a wire is shorted with its immediate neighbor, the tester's reaction differs from the example just presented. With a short, the odd wire's RbX/RbX' voltage divider is connected to the even wire's RcX/RcX' divider through the path created by the wire fault. This connection completes the electrical path from the +5V regulator RcX/RcX' divider to ground the RbX/RbX' divider. With the closing of the circuit, the two voltage dividers lie in series and current is able to flow. As current flow begins, the output of each voltage divider changes to a value that lies between the source voltage and ground. For the even-numbered wires, this change makes relatively little difference in the outcome. Because the overall voltage divider ratio still permits it, the output (VREFLOW) of the RcX/RcX' divider remains high, keeping the output of the associated EXCLUSIVE NOR gate at a high logic level. However, in the case of the off-numbered wires, the ratio change alerts the tester to the presence of the fault. For the RbX/RbX' divider, the value of the grounded resistance is now large enough to force the VREFHI divider output to a voltage that the attached EXCLUSIVE OR gate recognizes as a high logic level. The high VREFHI level combines with the input to switch 100 to drive the EXCLUSIVE OR gate's output low.

Status Display Operation

Output 110 of each gate in the comparator array is delivered to the status display circuitry, shown in FIG. 3. The status display circuitry drives a set of LEDs visible to the user; these LEDs include a PASS indicator 190 which is normally lit, a FAIL indicator 200 which is normally extinguished, and an individual fault indicator 130 for each wire in the cable harness. Indicators 130 are normally extinguished. For both the Open Mode and the Short Mode test, the status display circuitry recognizes a high gate output as an indication that the associated wire passed the test. A low gate output, on the other hand, indicates that the wire in question is faulty. The following describes the operation of the display circuitry under each of these conditions. For purposes of illustration, the example is divided into two parts; the first describes the status display for a good test wire and the second a faulty test wire.

Good Test Wire: When the status display circuitry receives a high logic level from the EXCLUSIVE OR or EXCLUSIVE NOR gate for a particular test wire, the high logic level is NANDed with the output for each of the remaining test wires in the group, as shown in FIG. 3A. Provided that none of the other test wires in the group had a low logic level as a comparator output, NAND gate 150 passes a low output to two-input NOR gate 160. The other NOR gate's input is tied to the output of the NAND gate for the adjacent comparator group. If both comparator groups yield low outputs from NAND gates 150, the NOR gate activates, sending a high output to final NAND gate 170. Given that the output of each NOR gate is high, the NAND gate's output is driven low. This low logic level allows PASS LED 190 to remain lit and, when transmitted across FAIL INVERTER 180, inhibits FAIL LED 200.

Faulty Test Wire: If the status display circuitry receives a low output from one of the EXCLUSIVE OR or EXCLUSIVE NOR gates, the lower logic level allows a voltage drop across fault LED 130 for the test wire associated with the gate. This LED now lights. The low logic level is then NANDed with the outputs of the remaining test wires in the group. Because it receives a low output from the faulty wire, NAND gate 150 furnishes a high output. This output, in turn, drives the output of attached NOR gate 160 low. When final NAND gate 170 senses the low from the NOR gate, it transmits a high output to the PASS/FAIL network, extinguishing PASS LED 190. FAIL inverter 180 translates the high logic level to a low logic level, lighting FAIL LED 200.

Internal Self-Tests

The tester can perform a self-test against its CMOS comparator array when powered up and set to Short Mode with no test cable harness attached (FIG. 6). In this case, a failing EXCLUSIVE OR gate 80 OR EXCLUSIVE NOR gate 90 will provide a low output. The tester will then light individual fault indicator 130 (FIG. 3) associated with that gate. The tester can also perform a source voltage check when powered up and set to Open Mode with no cable harness attached. In this case, all fault indicators 130 will light. If the display is dim, the battery is weak.

Scope

While the above description contains many specificities, the reader should not construe these as limitations on the scope of the invention, but merely as exemplifications of preferred embodiments thereof. Those skilled in the art will envision many other possible variations are within its scope. For example, skilled artisans will readily be able to change the dimensions and shapes of the various embodiments. They will be able to use various voltage dividers and regulators and still be within the scope of the invention. They can make the device hand-held as in the preferred embodiment, or as an alternative, devise larger devices for use in a manufacturing environment without departing from the scope of the invention. Accordingly, the reader is requested to determine the scope of the invention by the appended claims and their legal equivalents, and not by the examples which have been given.

I claim:

1. An apparatus for testing wire faults in a multi-conductor wiring harness, comprising:
   (a) a power supply source having first and second output terminals,
   (b) first and second connectors, each of said connectors including a plurality of first terminals and a plurality of second terminals,
   (c) a first plurality of resistor pairs,
   (d) a second plurality of resistor pairs,
   (e) a third plurality of resistor pairs,
   (f) each pair of resistors of said first, second, and third pluralities of resistor pairs being connected in series to form a voltage divider which has a common junction point between the resistors of each pair, the relative values of the resistors of each pair being selected to provide a predetermined ratio, (g) each of said resistor pairs of said first plurality of resistor pairs being connected between said first and second terminals of said power supply source, (h) each common junction point of each of said resistor pairs of said first plurality of resistor pairs being connected to a respective one of said first terminals of said first connector, (i) each of said resistor pairs of said second plurality of resistor pairs being connected between a respective one of said first terminals of said second connector and said second terminal of said power supply source, (j) each common junction point of each of said resistor pairs of said second plurality of resistor pairs forming a respective output point for a test of the connections between corresponding ones of said first terminals of said first and second connectors, (k) each of said resistor pairs of said third plurality of resistor pairs being connected between a respective one of said second terminals of said second connector and said first terminal of said power supply source, (l) each common junction point of each of said resistor pairs of said third plurality of resistor pairs forming a respective output point for a test of the connections between corresponding ones of said second terminals of said first and second connectors, (m) means connecting each of said second terminals of said first connector to said second terminal of said power supply source, (n) a plurality of logic level sensing means connected to said respective output points at the junctions of said resistor pairs of second plurality of resistor pairs for providing a plurality of one of two logic level outputs, designated high and low, depending upon the level of the voltages at said respective output points, whereby when a wiring harness having a plurality of wires and two end connectors is mated with said apparatus such that said two end connectors mate with said first and second connectors, respectively, the wiring in said harness can be easily and rapidly tested.

2. The apparatus of claim 1 wherein said plurality of first terminals are the odd terminals of said connectors and said plurality of second terminals are the even terminals of said connectors.

3. The apparatus of claim 1 wherein said first and second output terminals of said power supply source are an active terminal and ground, respectively.

4. The apparatus of claim 1 wherein said logic level sensing means comprise a plurality of complimentary metal-oxide semicondutor circuits.

5. The apparatus of claim 4 wherein said plurality of complimentary metal-oxide semiconductor circuits are provided in a very large scale integrated circuit array.

6. The apparatus of claim 1 wherein each of said plurality of logic level sensing means is a logic comparator, each logic comparator having a plurality of inputs, one input of each comparator being connected to a respective one of said output points at the junctions of said resistor pairs of second plurality of resistor pairs, the other inputs of said comparators being connected to said second terminal of said power supply source.

7. The apparatus of claim 6, further including single-pole, double-throw switch means for connecting said other inputs of said comparators to either second or said first terminal of said power supply source.

8. The apparatus of claim 1, further including another plurality of logic level sensing means connected to said respective output points at the junctions of said resistor pairs of said third plurality of resistor pairs for providing a plurality of one of two logic level outputs, designated high and low, depending upon the level of the voltages at said respective output points of said third plurality of resistor pairs.

9. The apparatus of claim 8 wherein each of said plurality of logic level sensing means of said first-named plurality and said other plurality is a logic comparator, each logic comparator having a plurality of inputs, one input of each comparator being connected to a respective one of said output points at the junctions of said resistor pairs of second and third plurality of resistor pairs, the other inputs of said comparators being connected to said one of said terminals of said power supply source.

* * * * *

UNITED STATES PATENT AND TRADEMARK OFFICE
CERTIFICATE OF CORRECTION

PATENT NO. : 5,155,440
DATED : October 13, 1992
INVENTOR(S) : George S.K. Huang

It is certified that error appears in the above-indentified patent and that said Letters Patent is hereby corrected as shown below:

On the Title page, item [57], Abstract, col. 2, line 1, change "cable harness" to --cables and cable harnesses--.
line 19, after "array" insert --and--.

Signed and Sealed this

Fifteenth Day of March, 1994

BRUCE LEHMAN

*Attest:*

*Attesting Officer*  Commissioner of Patents and Trademarks